United States Patent
Dennison et al.

Patent Number: 5,155,057
Date of Patent: Oct. 13, 1992

[54] STACKED V-CELL CAPACITOR USING A DISPOSABLE COMPOSITE DIELECTRIC ON TOP OF A DIGIT LINE

[75] Inventors: Charles H. Dennison; Pierre C. Fazan; Ruojia Lee; Yauh-Ching Liu, all of Boise, Id.

[73] Assignee: Micron Technology, Inc., Boise, Id.

[21] Appl. No.: 609,281

[22] Filed: Nov. 5, 1990

[51] Int. Cl.⁵ .................. H01L 21/265; H01L 21/70
[52] U.S. Cl. ................................. 437/47; 437/52; 437/58
[58] Field of Search .................. 437/47, 48, 52; 357/23.5, 23.6; 148/DIG. 109

[56] References Cited

U.S. PATENT DOCUMENTS

| | | |
|---|---|---|
| 4,742,018 | 5/1988 | Kimura et al. ............ 437/48 |
| 5,071,781 | 10/1991 | Seo et al. ............... 437/52 |

FOREIGN PATENT DOCUMENTS

| | | | |
|---|---|---|---|
| 0295709 | 12/1988 | European Pat. Off. ........ 437/52 |
| 0388075 | 9/1990 | European Pat. Off. ........ 437/43 |
| 0290256 | 11/1989 | Japan ..................... 437/52 |
| 0072672 | 3/1990 | Japan ..................... 437/52 |
| 0152274 | 6/1990 | Japan ..................... 437/52 |
| 2-246150 | 10/1990 | Japan ..................... 437/52 |

Primary Examiner—Olik Chaudhuri
Assistant Examiner—Loc Q. Trinh
Attorney, Agent, or Firm—David J. Paul

[57] ABSTRACT

A stacked v-cell (SVC) capacitor using a modified stacked capacitor storage cell fabrication process. The SVC capacitor is made up of a polysilicon structure, having a v-shaped cross-section, located at a buried contact and extending to an adjacent storage node overlaid by polysilicon with a dielectric sandwiched in between. The addition of the polysilicon structure increases storage capability 70% without enlarging the surface area defined for a normal stacked capacitor cell.

12 Claims, 8 Drawing Sheets

STACKED V-CELL CAPACITOR USING A DISPOSABLE COMPOSITE DIELECTRIC ON TOP OF A DIGIT LINE

FIELD OF THE INVENTION

This invention relates to semiconductor circuit memory storage devices and more particularly to the design of three-dimensional stacked cell capacitors used in high-density dynamic random access memory (DRAM) arrays.

BACKGROUND OF THE INVENTION

In dynamic semiconductor memory storage devices it is essential that storage node capacitor cell plates be large enough to retain an adequate voltage level in spite of parasitic capacitances and noise that may be present during circuit operation. As is the case for most semiconductor integrated circuitry, circuit density is continuing to increase at a fairly constant rate. The issue of maintaining storage node capacitance is particularly important as the density of DRAM arrays continue to increase for future generations of memory devices.

The ability to densely pack storage cells while maintaining required storage capabilities is a crucial requirement of semiconductor manufacturing technologies if future generations of expanded memory array devices are to be successfully manufactured.

One method of maintaining, as well as increasing, storage node size in densely packed memory devices is through the use of "stacked storage cell" design. With this technology, planarized layers of a conductive material such as polycrystalline silicon (polysilicon or poly) are deposited over an access device on a silicon wafer with dielectric layers sandwiched between each poly layer. A cell constructed in this manner is known as a stacked capacitor cell (STC). Such a cell utilizes the space over the access device for capacitor plates, has a low soft error rate (SER) and may be used in conjunction with inter-plate insulative layers having a high dielectric constant.

However, it is difficult to obtain sufficient storage capacitance with a conventional STC capacitor as the storage electrode area is confined within the limits of its own cell area. Also, maintaining high dielectric breakdown between poly layers in the STC capacitor becomes a major concern once insulator thickness is appropriately scaled.

A paper submitted by T. Ema, S. Kawanago, T. Nishi, S. Yoshida, H. Nishibe, T. Yabu, Y. Kodama, T. Nakano and M. Taguchi, entitled "3-DIMENSIONAL STACKED CAPACITOR CELL FOR 16M AND 64M DRAMS," IEDM, Dig. Tech. Papers, pp. 592-595, 1988, herein incorporated by reference, discusses a 3-dimensional stacked capacitor fin structure.

The fin structure and its development is shown in FIG. 1, pp. 593 of the article mentioned above. The storage node is formed by two polysilicon layers, called fins, with gaps between the fins (the number of fins can be increased, but is limited by design rules used). Capacitor dielectric film surrounds the whole surface of the fins with polysilicon (used for a capacitor cell plate) covering the fins and filling in the gaps. This design can be fabricated using current methods and increases storage capacitance, but it is not suitable for a deep submicron (such as 0.2 micron) design rule DRAM cell because the total thickness of several fins and cell plate is much larger than minimum feature size. The process flow, needed to realize this fin structure, requires precise alignment between two adjacent word lines and digits lines. This alignment along with the requirement to have the storage node poly overlap the storage node contact leads to a larger cell area that is not suitable for 0.2 micron design rules mentioned previously.

Also, in a paper submitted by S. Inoue, K. Hieda, A. Nitayama, F. Horiguchi and F. Masuoka, entitled "A SPREAD STACKED CAPACITOR (SSC) CELL FOR 64MBIT DRAMS," IEDM, Dig. Tech. Papers, pp. 31-34, 1989, herein incorporated by reference, discusses a storage electrode of a 1st memory cell being expanded to the neighboring 2nd memory cell area.

The SSC cell fabrication process (refer to FIG. 2 pp. 32) begins with a storage electrode deposited above the digit lines that is expanded from the 1st memory cell to its adjacent memory cells and visa versa. This results in a stacked capacitor arrangement where each storage electrode can occupy two memory cell areas, thus almost doubling the storage capacitance of one memory cell.

However, the SSC process is complicated and adds at least two masks to the standard process and cannot be made with self-aligned contacts.

The present invention develops an existing stacked capacitor fabrication process to construct a three-dimensional stacked capacitor cell by using self aligned contacts without additional photolithography steps.

SUMMARY OF THE INVENTION

The invention is directed to maximizing storage cell surface area in a high density/high volume DRAM (dynamic random access memory) fabrication process. An existing stacked capacitor fabrication process is modified to construct a three-dimensional stacked V-cell (SVC) capacitor defined as a storage cell.

After a silicon wafer is prepared using conventional process steps, the present invention develops the SVC by creating a v-shaped poly structure conforming to the topology formed by three adjacent word lines running perpendicular to two adjacent digit lines, which results in increased capacitor plate surface area for each storage cell. Such a structure has the potential to increase the capacitance of a conventional STC cell by 70%.

The invention will allow the maintenance of adjacent capacitance within a DRAM cell as geometries are dramatically shrunk.

DETAILED DESCRIPTION OF THE PREFERRED EMBODIMENT

The invention is directed to maximizing storage cell surface area in a high density/high volume DRAM fabrication process, in a sequence shown in FIGS. 1-9.

A silicon wafer is prepared using conventional process steps up to the point of defining a cell array. Capacitor fabrication will now follow.

The capacitor of each cell will make contact with a buried contact within the cell, while the capacitor will extend to the active area of an adjacent cell. Each active area within the array is isolated from one another by a thick field oxide and arranged in interdigitated columns and non-interdigitated rows. The active areas are used to form active MOS transistors that can be doped as NMOS or PMOS type FETs depending on the desired use.

Figure 1:
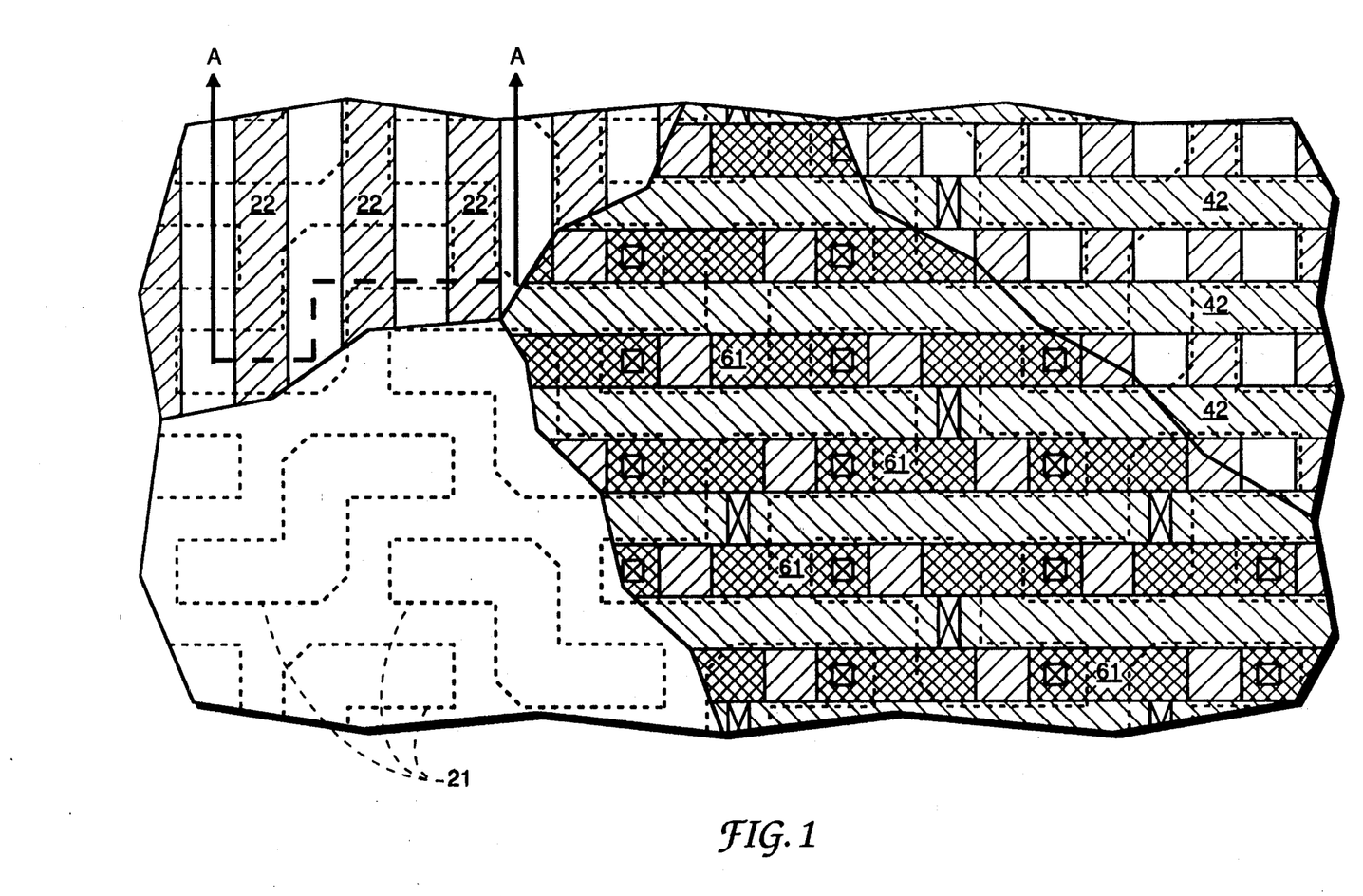
FIG. 1 is a top planar view of a portion of an in-process wafer showing digit lines, word lines, active areas and storage capacitors.

FIG. 1 shows a top planar view portion of a completed multilayered memory array with the main building blocks comprising digit lines 42, word lines 22, active area 21, and an SVC storage node state 61. Active areas 21 have been implanted in such a manner as to have each adjacent active area interweave with one another in the row direction (defined by parallel word lines 22) thereby forming parallel interdigitated rows of active areas 21. In the column direction (defined by parallel digit lines 42) each adjacent active area 21 run end to end thereby forming parallel non-interdigitated columns of active areas 21. A stacked capacitor structure of the preferred embodiment (the SVC) is self-aligned to and over the top of word lines 42 as well as to digit lines 22.

Figure 2:
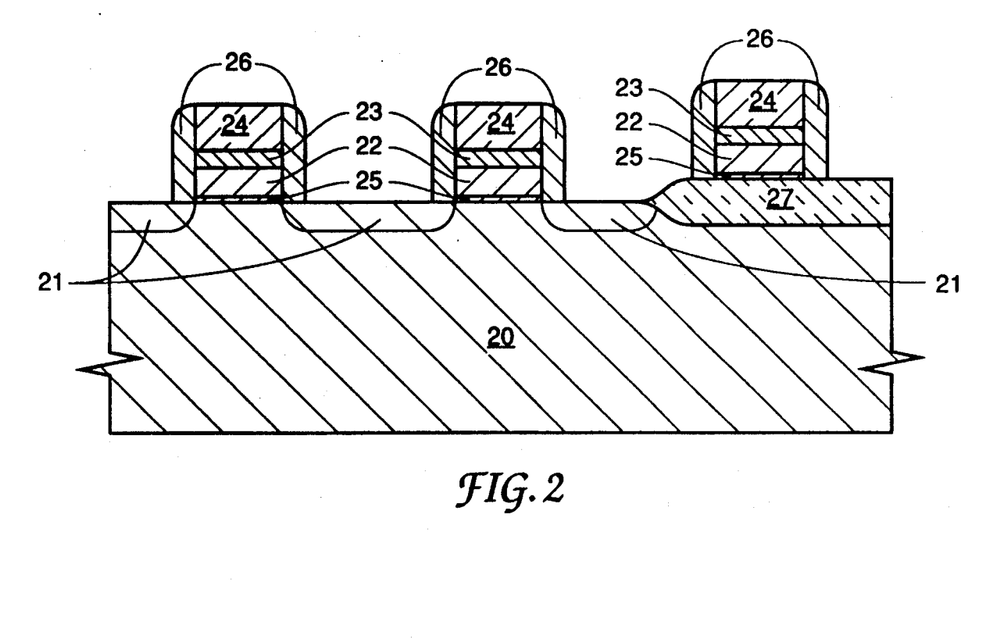
FIG. 2 is a cross-sectional view through broken line A—A of FIG. 1.

As shown in FIG. 2, parallel poly word lines 22, covered with silicide 23 and dielectric 24 (either oxide or nitride) and further isolated from subsequent conductive layers by dielectric spacers 26 (either oxide or nitride), have been previously deposited over a thin layer of gate oxide 25 or a thick layer of field oxide 27. Active areas 21 have been appropriately doped to a desired conductivity type which penetrates into the bulk silicon wafer 20, by conventional process steps. Now the wafer is ready for digit line formation that will run perpendicular to and over the top of the word lines 22.

Figure 3:
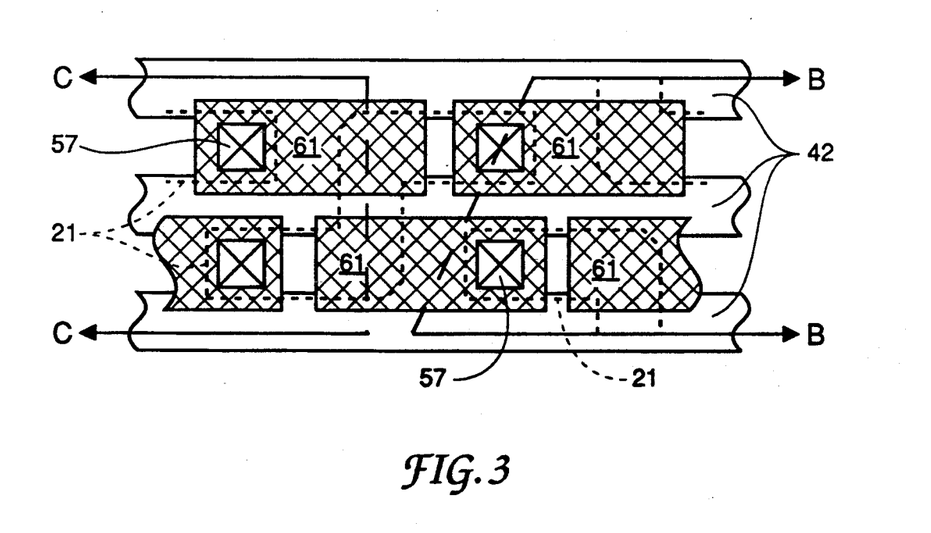
FIG. 3 is a top planar view of a portion of an in-process wafer showing digit lines, storage node contacts and storage capacitors.

FIG. 3 shows a top planar view of a portion of an in-process wafer showing parallel digit lines 42, storage node contacts 57, active areas 21 and storage capacitors 61.

Figure 4A:
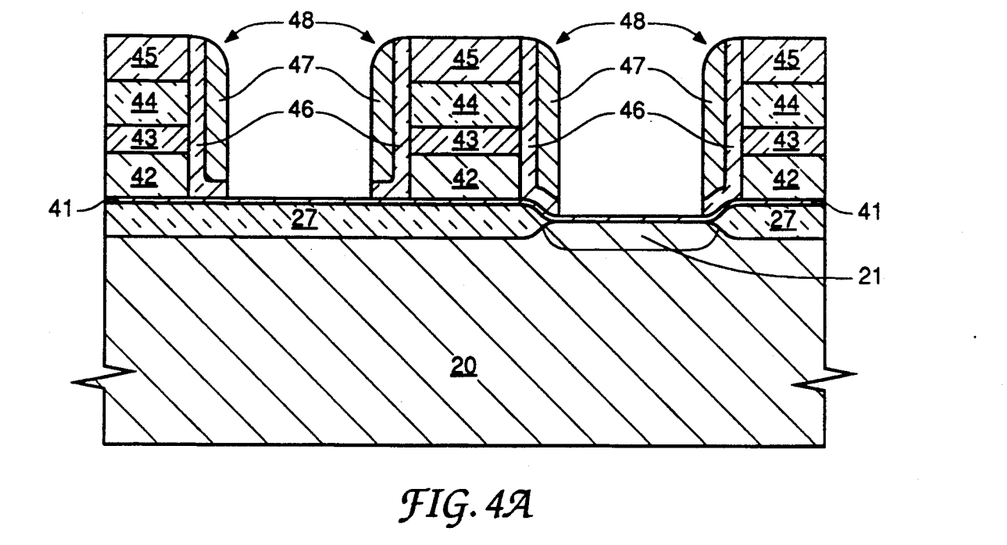
FIGS. 4a and 4b are cross-sectional views of the in-process wafer through broken line B—B of FIG. 3 following a dielectric spacer etch.
Figure 4B:
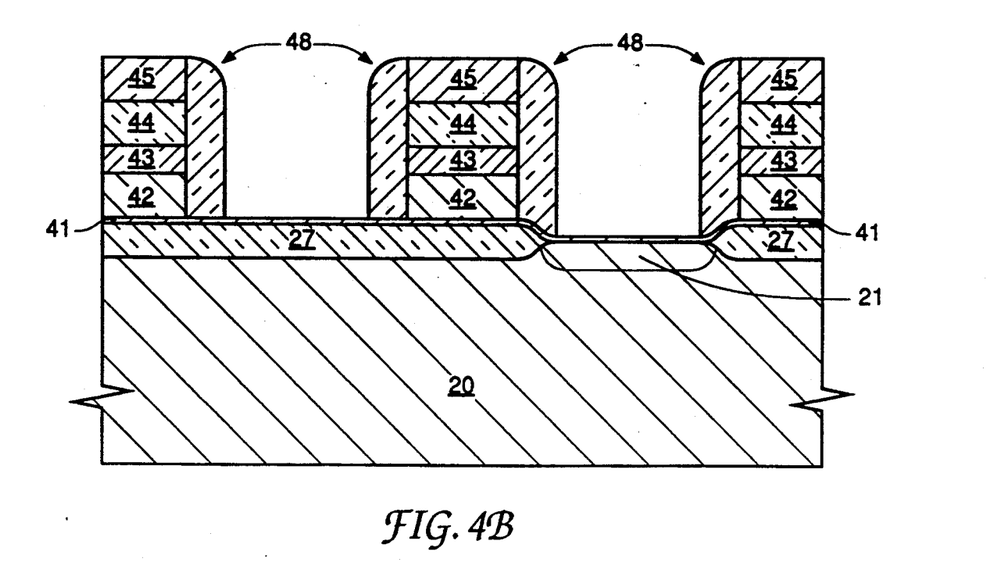

Up to this point, process flow has followed that of an array comprising conventional buried digit lines stacked capacitor cells. From this point forward, the process is unique to an array having SVC-type storage capacitors. As shown in FIG. 4, an oxide layer 41 is deposited over the entire wafer array surface followed by digit line contact photo and etch and blanket depositions of polysilicon 42, silicide 43 and first and second dielectrics 44 and 45, respectively. Dielectric 44 can be either nitride or oxide and is deposited by chemical vapor deposition (CVD) which is preferred for its excellent conformity. Dielectric 45 can be either nitride or doped oxide. In the preferred embodiment, dielectric 44 is oxide and dielectric 45 is nitride. However, dielectric 44 could be densified oxide, obtained through an annealing process, (resulting in a less porous oxide that has 2 to 3 times lower etch rate then that of normal oxide) covered by dielectric 45 being a doped oxide and basically the same desired results will be achieved. The layers of polysilicon 42, silicide 43 and dielectrics 44 and 45 are patterned and etched with polysilicon 42, previously being conductively doped, in conjunction with silicide 43 to serve as parallel digit lines 42 covered with dielectric layers 44 and 45. Digit lines 42 run perpendicular to word lines 21 (shown in FIG. 2) and conform to the wafer surface resulting in a waveform-like topology running in both the digit line and word line directions.

Third and fourth dielectrics 46 and 47, such as nitride or oxide, are deposited, followed by an anisotropic etch to form dielectric spacers 48. As shown in FIG. 4a, in the preferred embodiment, spacer 48 is made up of dielectric 46 being oxide and dielectric 47 being nitride. However, as shown in FIG. 4b, spacer 48 can be made solely of a single dielectric such as oxide.

Figure 5:
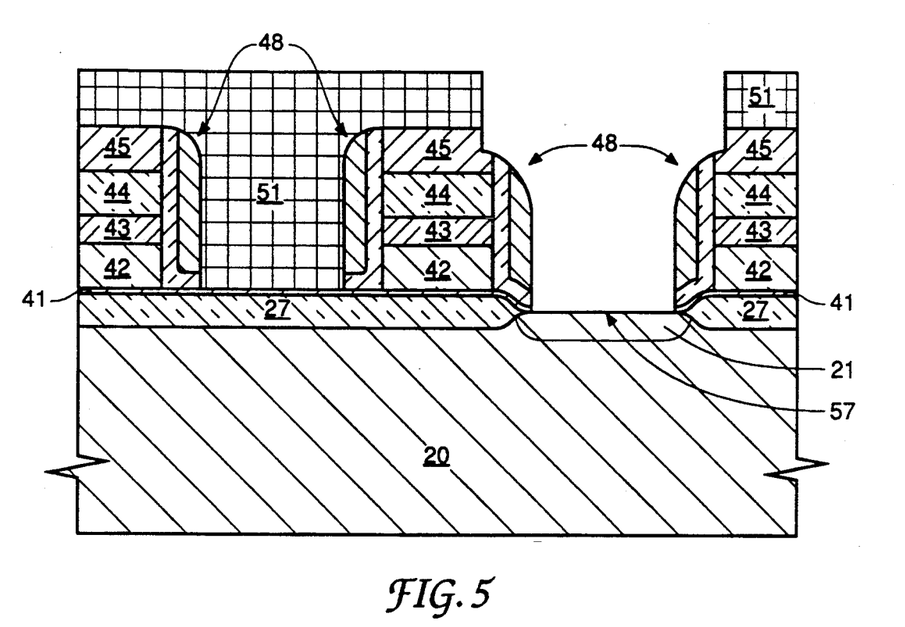
FIG. 5 is a cross-sectional view of the in-process wafer portion of FIG. 4a following a buried contact photo and etch.

As shown in FIG. 5, a buried contact 57, self-aligned to digit lines 42 by the presence of spacers 48, is located by covering all areas other than contact 57 with photoresist 51. After applying an appropriate photomask, a buried contact anisotropic etch on the exposed dielectric provides an opening to locate contact 57.

Figure 6:
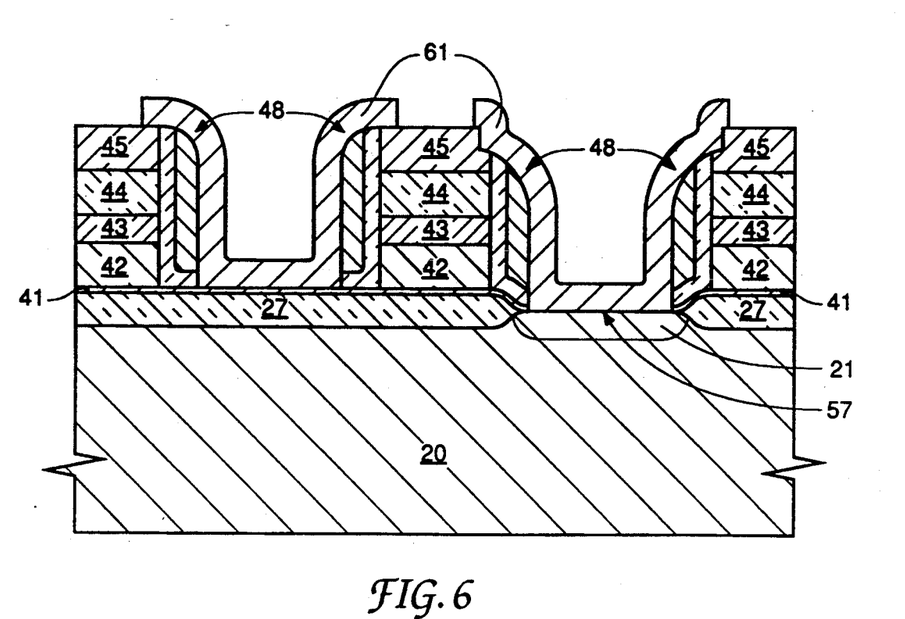
FIG. 6 is a cross-sectional view of the in-process wafer portion of FIG. 5 following a photoresist strip, a blanket deposition of conformal poly followed by poly doping and patterning of a poly storage node.

As shown in FIG. 6, the photoresist has been stripped and a conformal poly layer 61 is deposited, preferably by low temperature deposition, over the entire array surface and couples to active area 21 via buried contact 57. The low temperature deposition causes poly layer 61 to have a rugged textured surface that potentially doubles the surface area of poly layer 61. Poly layer 61 is conductively doped and patterned to serve as a bottom plate 61 of the SVC storage capacitor. Plate 61 extends over an adjacent poly word line (the word line is not shown as it runs parallel to cross-sectional views of FIG. 6) and continues to the next adjacent word line. Plate 61 conforms to the two perpendicular waveform-like topology (created after digit line formation) which run in both the word lines and the digit lines directions.

Figure 7A:
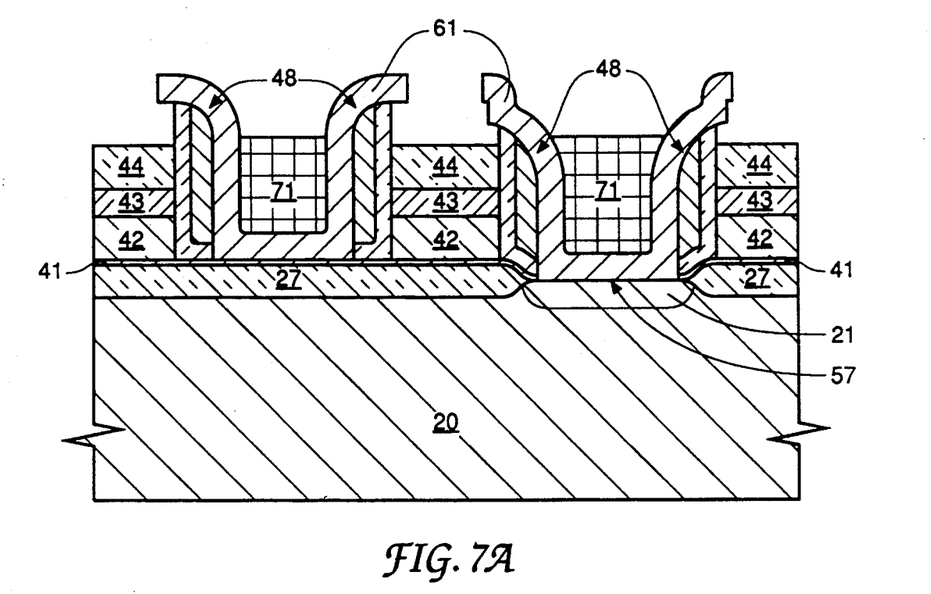
FIG. 7a is a cross-sectional view of the in-process wafer portion of FIG. 6
Figure 7B:
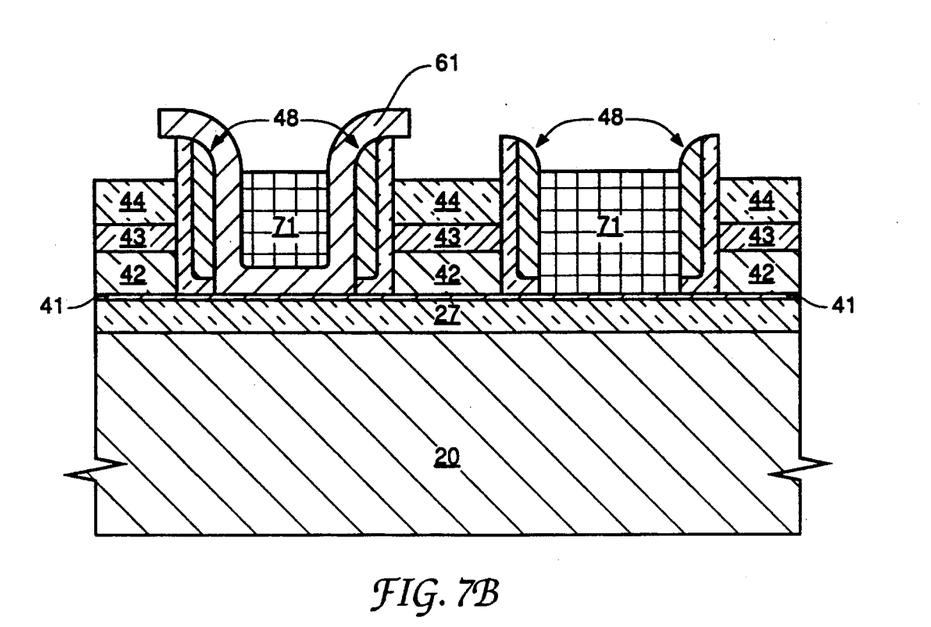
FIG. 7b is a cross-sectional view through broken line C—C following etching of a top dielectric, a coating of photoresist and a controlled plasma descumming process.

As shown in FIGS. 7a and 7b, the wafer is coated with a blanket layer of photoresist which is then is subjected to a plasma descumming process, leaving photoresist 71 residing in valleys between parallel digit lines 42. The main purpose for leaving a portion of photoresist 71 ,is shown in FIG. 7b. In areas between adjacent storage node plates 61, the nitride 47 portion of dielectric spacers 48 along with oxide 46 need to remain intact to isolate digit lines 42. Therefore, the presence of photoresist 71 covers and protects spacers 48, in the areas just mentioned, from a wet nitride and wet oxide spacer etch that follows. The wet nitride spacer etch removes disposable composite top dielectric 45 (of FIG. 6), in this case nitride, to expose oxide dielectric 44 and spacer 48.

Figure 8A:
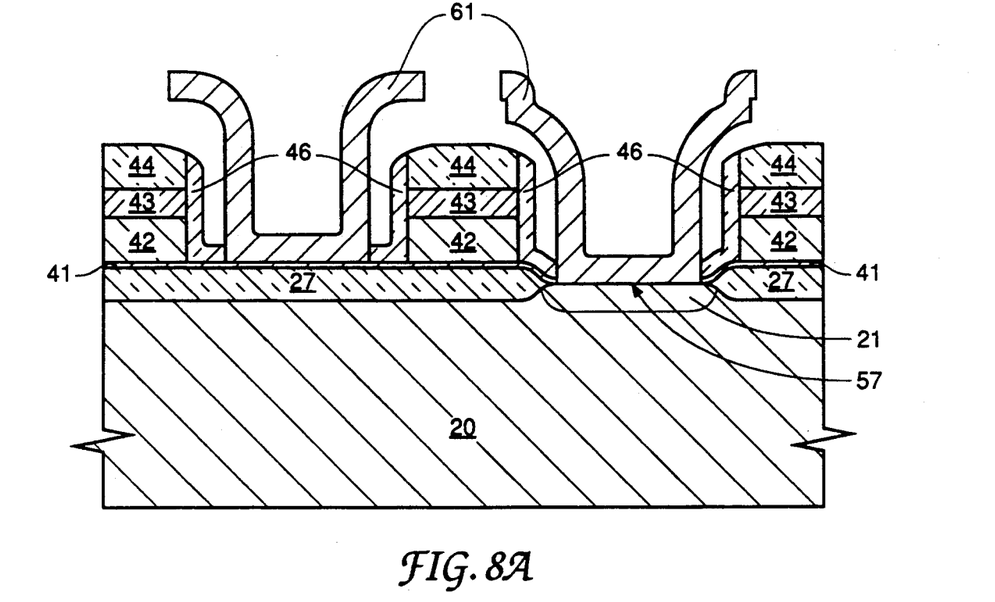
FIG. 8a is a cross-sectional view of the in-process wafer of portion of FIG. 7 following a series of controlled dielectric etches.

As shown in FIG. 8a, a controlled oxide etch removes a portion of oxide dielectrics 44 and 46, to expose nitride dielectric 47 (FIG. 7a) under storage node plate 61 only. The exposed portion of dielectric 47 is completely removed by a subsequent nitride wet etch followed by a complete strip of resist 71.

Figure 8B:
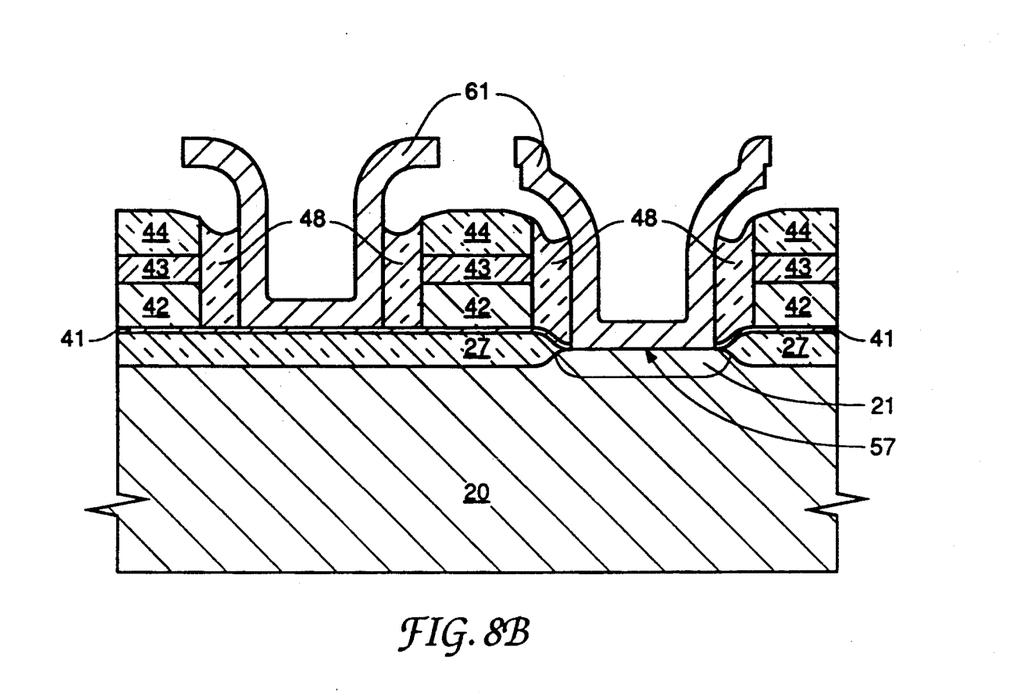
FIG. 8b is a cross-sectional view of the in-process wafer portion of FIG. 4b in conjunction with process steps of FIGS. 5 through 7, following a controlled dielectric etch.

Alternately, as shown is FIG. 8b, when spacer 48 is solely oxide, a portion of spacer 48 is etched away during the oxide etch and the nitride wet etch is eliminated. In either case, plate 61 is now ready for deposition of an isolation layer serving as a capacitor dielectric.

Figure 9A:
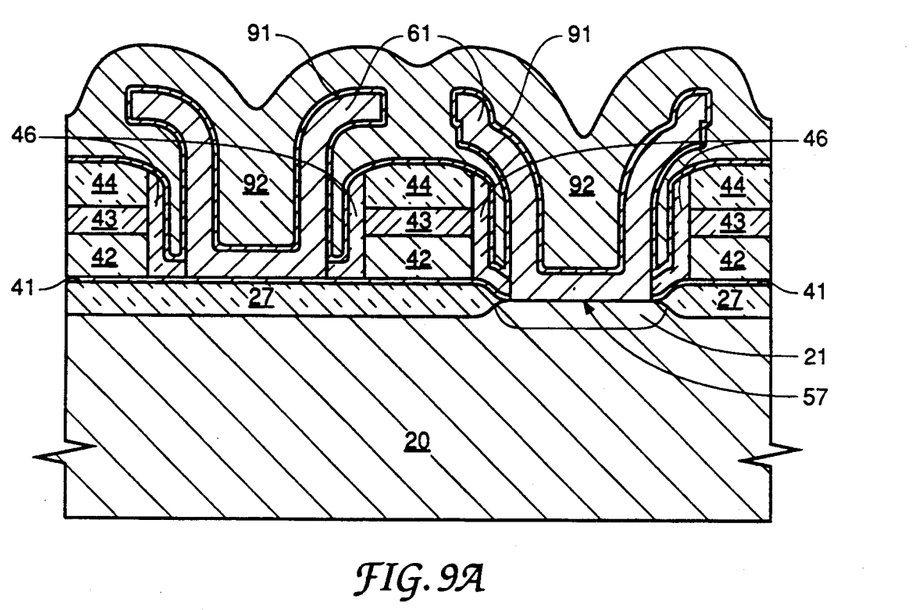
FIGS. 9a and 9b are cross-sectional views of the in-process wafer of portion of FIGS. 8a and 8b respectfully, following a photoresist strip, a blanket deposition of conformal nitride, and a blanket deposition of conformal poly.
Figure 9B:
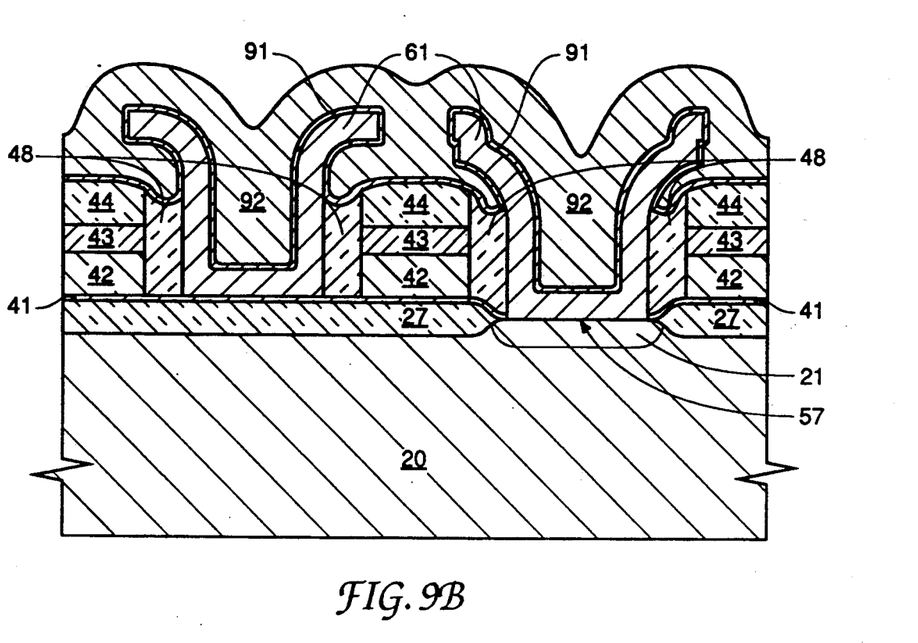

Referring to both FIGS. 9a and 9b, a dielectric layer of nitride 91 is deposited that conforms to both the inside and outside surfaces of plate 61. Following nitride 91 deposition, a blanket deposition of conformal poly 92 is performed that is conductively doped to serve as a top poly capacitor cell plate 92 of the SVC storage capacitor which also becomes a common cell plate to all SVC storage capacitors in the array.

Once again, depending on the dielectrics selected for spacer 48, a deeper v-shaped cross-sectional poly structure resembling that of FIG. 9a results from using a combination of oxide and nitride. If spacer 48 is solely oxide, a shallower v-shaped cross-sectional poly structure resembling that of FIG. 9b results.

With the addition of poly plate 61 as the storage node plate along with top capacitor cell plate 82 that surrounds plate 61, substantial capacitor plate surface area is gained at the storage node. Since capacitance is mainly affected by the surface area of a capacitor's cell plates the additional area gained by a 3-dimensional SVC structure can provide a 70% increase in capacitance over that of a conventional STC capacitor, without more space than that required for defining a stacked capacitor storage cell. If rugged poly is used to form plate 61 the overall capacitance can potentially be doubled.

It is to be understood that although the present invention has been described with reference to a preferred embodiment, various modifications, known to those skilled in the art, may be made to the structures and process steps presented herein without departing from the invention as recited in the several claims appended hereto.

We claim:

1. A process for fabricating a DRAM array on a silicon substrate, said process comprising the following sequence of steps:
    creating a plurality of separately isolated active areas arranged in parallel interdigitated rows and parallel non-interdigitated columns;
    creating a gate dielectric layer on top of each active area;
    depositing a first conductive layer superjacent surface of said array;
    depositing a first dielectric layer superjacent said first conductive layer;
    masking and etching said first conductive and said first dielectric layers to form a plurality of parallel conductive word lines aligned along said rows such that each said word line passes over a inner portion of each said active area being separated therefrom by a remnant of said gate dielectric layer;
    creating a conductively-doped digit line junction and storage node junction within each said active area on opposite sides of each said word line;
    depositing a second dielectric layer superjacent said array surface;
    creating a first self-aligned buried contact location at each said digit line junction in each said active area;
    depositing a second conductive layer superjacent said array surface, said second conductive layer making direct contact to said digit line junctions at said first buried contact locations;
    depositing a third dielectric layer superjacent to said second conductive layer;
    depositing a fourth dielectric layer superjacent to said third dielectric layer;
    masking and etching said second conductive layer and said third and said fourth dielectric layers to form a plurality of parallel conductive digit lines aligned along said columns such that a digit line makes electrical contact at each digit line junction within a column, said digit lines running perpendicular to and over said word lines forming a 3-dimensional, waveform-like topology;
    depositing a fifth dielectric layer superjacent said array surface;
    etching said fifth dielectric layer to form vertical spacers adjacent said digit lines and said third and said fourth dielectrics;
    creating a second self-aligned buried contact location at each said storage node junction in each said active area;
    depositing a third conductive layer superjacent said array surface assuming said waveform-like topology in response to existing topology, said third conductive layer making contact to said storage node junctions at said second buried contact locations;
    etching said fourth dielectric layer;
    patterning said third conductive layer to form a storage node plate at each said storage node junction, said storage node plate having a v-shaped cross-section;
    etching said vertical spacers in a vertical direction;
    depositing a cell dielectric layer adjacent and coextensive with said storage node plate and adjacent said array surface; and
    depositing a fourth conductive layer adjacent to and coextensive with said cell dielectric layer to form a cell plate common to the entire memory array.

2. A process as recited in claim 1, wherein said gate dielectric layer is oxide.

3. A process as recited in claim 1, wherein said first and said second conductive layers comprise a layer of tungsten silicide and doped polysilicon.

4. A process as recited in claim 1, wherein said first, said second, said third, said fourth and said fifth dielectric layers are selected from the group consisting essentially of oxide or nitride.

5. A process as recited in claim 1, wherein said fourth dielectric is nitride and etching of said fourth dielectric is a wet nitride etch.

6. A process as recited in claim 1, wherein said spacers have an inner layer of oxide and an outer layer of nitride and said etching of said spacers is a controlled oxide etch followed by nitride wet etch.

7. A process as recited in claim 1, wherein said spacers are solely oxide and said etching of said spacers is a controlled oxide etch.

8. A process as recited in claim 1, wherein said third and said fifth dielectrics are TEOS.

9. A process as recited in claim 1, wherein said third, and said fourth conductive layers are doped polysilicon.

10. A process as recited in claim 9, wherein said third conductive layer is deposited by low temperature deposition.

11. A process as recited in claim 1, wherein said second dielectric layer is deposited by chemical vapor deposition.

12. A process as recited in claim 1, wherein said cell dielectric layer is nitride.

* * * * *